(12) United States Patent
Hietala et al.

(10) Patent No.: US 7,212,580 B2
(45) Date of Patent: May 1, 2007

(54) MULTI-LEVEL SIGNAL CLOCK RECOVERY TECHNIQUE

(75) Inventors: Vincent Mark Hietala, Albuquerque, NM (US); Andrew Joo Kim, Atlanta, GA (US)

(73) Assignee: Quellan, Inc., Atlanta, GA (US)

(*) Notice: Subject to any disclaimer, the term of this patent is extended or adjusted under 35 U.S.C. 154(b) by 806 days.

(21) Appl. No.: 10/366,112

(22) Filed: Feb. 12, 2003

(65) Prior Publication Data

US 2003/0156655 A1 Aug. 21, 2003

Related U.S. Application Data

(60) Provisional application No. 60/357,362, filed on Feb. 15, 2002.

(51) Int. Cl.
*H04L 25/49* (2006.01)

(52) U.S. Cl. ............ 375/293; 375/286; 375/287; 375/317; 375/360

(58) Field of Classification Search .......... 375/293, 375/286, 287, 317, 360
See application file for complete search history.

(56) References Cited

U.S. PATENT DOCUMENTS

| | | | |
|---|---|---|---|
| 2,632,058 A | 3/1953 | Gray | |
| 3,445,771 A | 5/1969 | Clapham et al. | |
| 3,571,725 A | 3/1971 | Kaneko et al. | |
| 3,599,122 A | 8/1971 | Leuthoki | 333/29 |
| 3,633,108 A * | 1/1972 | Kneuer | 375/254 |
| 3,714,437 A | 1/1973 | Kinsel | |
| 3,806,915 A | 4/1974 | Higgins et al. | |
| 3,977,795 A | 8/1976 | Buschmann | |
| 4,201,909 A | 5/1980 | Dogliotti et al. | 455/608 |
| 4,287,756 A | 9/1981 | Gallagher | |
| 4,288,872 A | 9/1981 | Tamburelli | 375/14 |
| 4,349,914 A | 9/1982 | Evans | |
| 4,363,127 A | 12/1982 | Evans et al. | |

(Continued)

FOREIGN PATENT DOCUMENTS

EP    0 527 966 B1    9/1994

(Continued)

OTHER PUBLICATIONS

International Search Report dated May 29, 2003 for International Application No. PCT/US03/04626.

(Continued)

*Primary Examiner*—Jay K. Patel
*Assistant Examiner*—Anna Ziskind
(74) *Attorney, Agent, or Firm*—King & Spalding LLP; Steven P. Wigmore

(57) ABSTRACT

Clock recovery of a multi-level (ML) signal can be performed in a two-step process. First, the transitions within the ML signal can be detected by a novel transition detector (TD). And second, the output of the TD circuit can comprise a pseudo-non-return-to-zero (pNRZ) signal that can drive a conventional OOK clock recovery (CR) IC. The TD circuit can convert the edges of the ML signal into the pseudo-NRZ (pNRZ) signal. The TD circuit can capture as many transitions as possible to allow the conventional NRZ clock recovery (CR) chip to optimally perform. The TD circuit can differentiate the ML signal in order to detect the ML signal's transitions.

6 Claims, 11 Drawing Sheets

U.S. PATENT DOCUMENTS

| | | |
|---|---|---|
| 4,386,339 A | 5/1983 | Henry et al. |
| 4,387,461 A | 6/1983 | Evans |
| 4,393,499 A | 7/1983 | Evans |
| 4,410,878 A | 10/1983 | Stach ........................ 340/347 |
| 4,464,771 A | 8/1984 | Sorensen |
| 4,470,126 A | 9/1984 | Haque |
| 4,475,227 A | 10/1984 | Belfield ...................... 381/30 |
| 4,479,266 A | 10/1984 | Eumurian et al. |
| 4,521,883 A | 6/1985 | Roche |
| 4,580,263 A | 4/1986 | Watanabe et al. |
| 4,584,720 A | 4/1986 | Garrett |
| 4,618,941 A | 10/1986 | Linder et al. |
| 4,646,173 A | 2/1987 | Kammeyer et al. ........... 360/51 |
| 4,651,026 A | 3/1987 | Serfaty et al. |
| 4,751,497 A | 6/1988 | Torii |
| 4,830,493 A | 5/1989 | Giebeler |
| 4,847,521 A | 7/1989 | Huignard et al. |
| 4,864,590 A | 9/1989 | Arnon et al. |
| 4,873,700 A | 10/1989 | Wong ........................... 375/76 |
| 4,912,726 A | 3/1990 | Iwamatsu et al. |
| 4,942,593 A | 7/1990 | Whiteside et al. |
| 4,953,041 A | 8/1990 | Huber ........................ 360/46 |
| 4,959,535 A | 9/1990 | Garrett |
| 4,978,957 A | 12/1990 | Hotta et al. |
| 5,007,106 A | 4/1991 | Kahn et al. |
| 5,008,957 A | 4/1991 | Kiyono |
| 5,012,475 A | 4/1991 | Campbell |
| 5,067,126 A | 11/1991 | Moore |
| 5,072,221 A | 12/1991 | Schmidt |
| 5,111,065 A | 5/1992 | Roberge |
| 5,113,278 A | 5/1992 | Degura et al. |
| 5,115,450 A | 5/1992 | Arcuri |
| 5,121,411 A | 6/1992 | Fluharty |
| 5,128,790 A | 7/1992 | Heidemann et al. |
| 5,132,639 A | 7/1992 | Blauvelt et al. |
| 5,151,698 A | 9/1992 | Pophillat |
| 5,181,034 A | 1/1993 | Takakura et al. |
| 5,181,136 A | 1/1993 | Kavehrad et al. |
| 5,184,131 A | 2/1993 | Ikeda |
| 5,208,833 A * | 5/1993 | Erhart et al. ................. 375/294 |
| 5,222,103 A | 6/1993 | Gross |
| 5,223,834 A | 6/1993 | Wang et al. |
| 5,225,798 A | 7/1993 | Hunsinger et al. |
| 5,237,590 A | 8/1993 | Kazawa et al. |
| 5,243,613 A | 9/1993 | Gysel et al. |
| 5,252,930 A | 10/1993 | Blauvelt |
| 5,282,072 A | 1/1994 | Nazarathy et al. |
| 5,283,679 A | 2/1994 | Wedding |
| 5,291,031 A | 3/1994 | MacDonald et al. |
| 5,293,406 A | 3/1994 | Suzuki |
| 5,300,930 A | 4/1994 | Burger et al. |
| 5,321,543 A | 6/1994 | Huber |
| 5,321,710 A | 6/1994 | Cornish et al. |
| 5,327,279 A | 7/1994 | Farina et al. |
| 5,343,322 A | 8/1994 | Pirio et al. |
| 5,351,148 A | 9/1994 | Maeda et al. |
| 5,355,240 A | 10/1994 | Prigent et al. |
| 5,361,156 A | 11/1994 | Pidgeon |
| 5,371,625 A | 12/1994 | Wedding et al. |
| 5,373,384 A | 12/1994 | Hebert |
| 5,376,786 A | 12/1994 | MacDonald |
| 5,382,955 A | 1/1995 | Knierim |
| 5,387,887 A | 2/1995 | Zimmerman et al. |
| 5,408,485 A | 4/1995 | Ries |
| 5,413,047 A | 5/1995 | Evans et al. |
| 5,416,628 A | 5/1995 | Betti et al. |
| 5,418,637 A | 5/1995 | Kuo |
| 5,424,680 A | 6/1995 | Nazarathy et al. |
| 5,428,643 A | 6/1995 | Razzell |
| 5,428,831 A | 6/1995 | Monzello et al. ........... 455/296 |
| 5,436,752 A | 7/1995 | Wedding |
| 5,436,756 A | 7/1995 | Knox et al. |
| 5,444,864 A | 8/1995 | Smith .......................... 455/84 |
| 5,450,044 A | 9/1995 | Hulick |
| 5,481,389 A | 1/1996 | Pidgeon et al. |
| 5,481,568 A | 1/1996 | Yada |
| 5,483,552 A | 1/1996 | Shimazaki et al. ......... 375/233 |
| 5,504,633 A | 4/1996 | Van Den Enden |
| 5,510,919 A | 4/1996 | Wedding |
| 5,515,196 A | 5/1996 | Kitajima et al. |
| 5,528,710 A | 6/1996 | Burton et al. |
| 5,541,955 A | 7/1996 | Jacobsmeyer ............... 375/222 |
| 5,548,253 A | 8/1996 | Durrant |
| 5,557,439 A | 9/1996 | Alexander et al. .......... 359/130 |
| 5,574,743 A | 11/1996 | van der Poel et al. |
| 5,589,786 A | 12/1996 | Bella et al. |
| 5,606,734 A | 2/1997 | Bahu .......................... 455/303 |
| 5,612,653 A | 3/1997 | Dodds et al. |
| 5,617,135 A | 4/1997 | Noda et al. ................... 348/12 |
| 5,621,764 A | 4/1997 | Ushirokawa et al. |
| 5,625,360 A | 4/1997 | Garrity et al. |
| 5,625,722 A | 4/1997 | Froberg et al. |
| 5,644,325 A | 7/1997 | King et al. |
| 5,648,987 A | 7/1997 | Yang et al. ................. 375/232 |
| 5,670,871 A | 9/1997 | Man et al. |
| 5,675,600 A | 10/1997 | Yamamoto et al. |
| 5,678,198 A | 10/1997 | Lemson |
| 5,689,356 A | 11/1997 | Rainal |
| 5,691,978 A | 11/1997 | Kenworthy .................. 370/278 |
| 5,692,011 A | 11/1997 | Nobakht et al. ............. 375/233 |
| 5,699,022 A | 12/1997 | Tovar ........................... 333/18 |
| 5,706,008 A | 1/1998 | Huntley, Jr. et al. |
| 5,721,315 A | 2/1998 | Evans et al. |
| 5,723,176 A | 3/1998 | Keyworth et al. |
| 5,751,726 A | 5/1998 | Kim |
| 5,754,681 A | 5/1998 | Watanabe et al. |
| 5,757,763 A | 5/1998 | Green et al. |
| 5,761,243 A | 6/1998 | Russell et al. |
| 5,764,542 A | 6/1998 | Gaudette et al. |
| 5,774,505 A | 6/1998 | Baugh ........................ 375/348 |
| 5,783,630 A | 7/1998 | Evans et al. |
| 5,784,032 A | 7/1998 | Johnston et al. |
| 5,790,595 A | 8/1998 | Benthin et al. |
| 5,798,854 A | 8/1998 | Blauvelt et al. |
| 5,801,657 A | 9/1998 | Fowler et al. |
| 5,802,089 A | 9/1998 | Link |
| 5,812,578 A | 9/1998 | Schemmann et al. |
| 5,825,211 A | 10/1998 | Smith et al. |
| 5,825,257 A | 10/1998 | Klymyshyn et al. |
| 5,825,825 A | 10/1998 | Altmann et al. |
| 5,828,329 A | 10/1998 | Burns |
| 5,835,848 A | 11/1998 | Bi et al. ........................ 455/24 |
| 5,839,105 A | 11/1998 | Ostendorf et al. |
| 5,841,841 A | 11/1998 | Dodds et al. |
| 5,844,436 A | 12/1998 | Altmann |
| 5,848,139 A | 12/1998 | Grover |
| 5,850,409 A | 12/1998 | Link |
| 5,850,505 A | 12/1998 | Grover et al. |
| 5,852,389 A | 12/1998 | Kumar et al. |
| 5,859,862 A | 1/1999 | Hikasa et al. |
| 5,861,966 A | 1/1999 | Ortel |
| 5,872,468 A | 2/1999 | Dyke |
| 5,878,390 A | 3/1999 | Kawai et al. |
| 5,880,870 A | 3/1999 | Sieben et al. |
| 5,883,910 A | 3/1999 | Link |
| 5,887,022 A | 3/1999 | Lee et al. |
| 5,889,759 A | 3/1999 | McGibney |
| 5,896,392 A | 4/1999 | Ono et al. |
| 5,912,749 A | 6/1999 | Harstead et al. |
| 5,920,600 A | 7/1999 | Yamaoka et al. |
| 5,923,226 A | 7/1999 | Kakura et al. |
| 5,942,576 A | 8/1999 | Evans et al. |
| 5,943,380 A | 8/1999 | Marchesani et al. |
| 5,943,457 A | 8/1999 | Hayward et al. |

| | | | |
|---|---|---|---|
| 5,949,926 A | 9/1999 | Davies | |
| 5,959,032 A | 9/1999 | Evans et al. | |
| 5,959,750 A | 9/1999 | Eskildsen et al. | |
| 5,965,667 A | 10/1999 | Evans et al. | |
| 5,968,198 A | 10/1999 | Hassan et al. | |
| 5,978,417 A | 11/1999 | Baker et al. | 375/232 |
| 5,983,178 A | 11/1999 | Naito et al. | |
| 5,985,999 A | 11/1999 | Dominguez et al. | |
| 5,995,565 A | 11/1999 | Tong et al. | 375/346 |
| 5,999,300 A | 12/1999 | Davies et al. | |
| 6,002,274 A | 12/1999 | Smith et al. | |
| 6,002,717 A | 12/1999 | Gaudet | |
| 6,009,424 A | 12/1999 | Lepage et al. | |
| 6,011,952 A | 1/2000 | Dankberg et al. | 455/24 |
| 6,021,110 A | 2/2000 | McGibney | |
| 6,028,658 A | 2/2000 | Hamada et al. | |
| 6,031,048 A | 2/2000 | Evans et al. | |
| 6,031,866 A | 2/2000 | Oler et al. | |
| 6,031,874 A | 2/2000 | Chennakeshu et al. | |
| 6,034,996 A | 3/2000 | Herzberg | |
| 6,035,080 A | 3/2000 | Henry et al. | |
| 6,041,299 A | 3/2000 | Schuster et al. | |
| 6,052,420 A | 4/2000 | Yeap et al. | 375/346 |
| 6,072,364 A | 6/2000 | Jeckeln et al. | |
| 6,072,615 A | 6/2000 | Mamyshev | |
| 6,078,627 A | 6/2000 | Crayford | |
| 6,084,931 A | 7/2000 | Powell, II et al. | |
| 6,091,782 A | 7/2000 | Harano | |
| 6,093,496 A | 7/2000 | Dominguez et al. | |
| 6,093,773 A | 7/2000 | Evans et al. | |
| 6,108,474 A | 8/2000 | Eggleton et al. | |
| 6,111,477 A | 8/2000 | Klymyshyn et al. | |
| 6,118,563 A | 9/2000 | Boskovic et al. | |
| 6,118,567 A | 9/2000 | Alameh et al. | |
| 6,127,480 A | 10/2000 | Dominguez et al. | |
| 6,140,416 A | 10/2000 | Evans et al. | |
| 6,140,858 A | 10/2000 | Dumont | |
| 6,140,972 A | 10/2000 | Johnston et al. | |
| 6,141,127 A | 10/2000 | Boivin et al. | |
| 6,141,387 A | 10/2000 | Zhang | |
| 6,148,428 A | 11/2000 | Welch et al. | |
| 6,151,150 A | 11/2000 | Kikuchi | |
| 6,154,301 A | 11/2000 | Harvey | |
| 6,163,638 A | 12/2000 | Eggleton et al. | |
| 6,169,764 B1 | 1/2001 | Babanezhad | 375/233 |
| 6,169,912 B1 | 1/2001 | Zuckerman | 455/570 |
| 6,181,454 B1 | 1/2001 | Nagahori et al. | |
| 6,191,719 B1 | 2/2001 | Bult et al. | |
| 6,201,916 B1 | 3/2001 | Eggleton et al. | |
| 6,208,792 B1 | 3/2001 | Hwang et al. | |
| 6,211,978 B1 | 4/2001 | Wojtunik | 359/114 |
| 6,212,654 B1 | 4/2001 | Lou et al. | |
| 6,214,914 B1 | 4/2001 | Evans et al. | |
| 6,215,812 B1 | 4/2001 | Young et al. | 375/144 |
| 6,219,633 B1 | 4/2001 | Lepage | |
| 6,222,861 B1 | 4/2001 | Kuo et al. | 372/20 |
| 6,226,112 B1 | 5/2001 | Denk et al. | |
| 6,236,963 B1 | 5/2001 | Naito et al. | |
| 6,259,836 B1 | 7/2001 | Dodds | |
| 6,259,847 B1 | 7/2001 | Lenz et al. | |
| 6,268,816 B1 | 7/2001 | Bult et al. | |
| 6,271,690 B1 | 8/2001 | Hirano et al. | 327/75 |
| 6,271,944 B1 | 8/2001 | Schemmann et al. | |
| 6,281,824 B1 | 8/2001 | Masuda | |
| 6,288,668 B1 | 9/2001 | Tsukamoto et al. | |
| 6,289,055 B1 | 9/2001 | Knotz | |
| 6,289,151 B1 | 9/2001 | Kazarinov et al. | |
| 6,295,325 B1 | 9/2001 | Farrow et al. | 375/327 |
| 6,297,678 B1 * | 10/2001 | Gholami | 327/198 |
| 6,298,459 B1 | 10/2001 | Tsukamoto | |
| 6,304,199 B1 | 10/2001 | Fang et al. | |
| 6,311,045 B1 | 10/2001 | Domokos | 455/78 |
| 6,313,713 B1 | 11/2001 | Ho et al. | 333/1.1 |
| 6,314,147 B1 | 11/2001 | Liang et al. | 375/346 |
| 6,317,247 B1 | 11/2001 | Yang et al. | 359/245 |
| 6,317,469 B1 | 11/2001 | Herbert | |
| 6,341,023 B1 | 1/2002 | Puc | |
| 6,356,374 B1 | 3/2002 | Farhan | 359/180 |
| 6,388,786 B1 | 5/2002 | Ono et al. | |
| 6,411,117 B1 | 6/2002 | Hatamian | 324/765 |
| 6,421,155 B1 | 7/2002 | Yano | |
| 6,445,476 B1 | 9/2002 | Kahn et al. | 359/184 |
| 6,473,131 B1 | 10/2002 | Neugebauer et al. | |
| 6,501,792 B2 | 12/2002 | Webster | |
| 6,539,204 B1 | 3/2003 | Marsh et al. | 455/63 |
| 6,560,257 B1 | 5/2003 | DeSalvo et al. | 372/38.02 |
| 6,665,348 B1 | 12/2003 | Feher | 375/259 |
| 6,665,500 B2 | 12/2003 | Snawerdt | |
| 6,718,138 B1 | 4/2004 | Sugawara | 398/9 |
| 6,751,587 B2 | 6/2004 | Thyssen et al. | 704/228 |
| 6,816,101 B2 | 11/2004 | Hietala et al. | 341/155 |
| 6,819,166 B1 | 11/2004 | Choi et al. | 327/551 |
| 6,961,019 B1 | 11/2005 | McConnell et al. | 342/357.1 |
| 7,035,361 B2 | 4/2006 | Kim et al. | 375/350 |
| 7,050,388 B2 | 5/2006 | Kim et al. | 370/201 |
| 2001/0024542 A1 | 9/2001 | Aina et al. | 385/24 |
| 2002/0086640 A1 | 7/2002 | Belcher et al. | 455/63 |
| 2002/0196508 A1 | 12/2002 | Wei et al. | |
| 2003/0002121 A1 | 1/2003 | Miyamoto et al. | |
| 2003/0008628 A1 | 1/2003 | Lindell et al. | 455/180.1 |
| 2003/0030876 A1 | 2/2003 | Takei | 359/187 |
| 2003/0053534 A1 | 3/2003 | Sivadas et al. | 375/229 |
| 2003/0058976 A1 | 3/2003 | Ohta et al. | 375/350 |
| 2003/0063354 A1 | 4/2003 | Davidson | 359/189 |
| 2003/0067990 A1 | 4/2003 | Bryant | 375/259 |
| 2004/0197103 A1 | 10/2004 | Roberts et al. | 398/159 |
| 2004/0213354 A1 | 10/2004 | Jones et al. | 375/285 |
| 2004/0218756 A1 | 11/2004 | Tang et al. | 379/417 |
| 2005/0069063 A1 | 3/2005 | Waltho et al. | 375/346 |

FOREIGN PATENT DOCUMENTS

| | | |
|---|---|---|
| EP | 0 584 865 B1 | 3/2000 |
| GB | 2 223 369 A | 4/1990 |
| GB | 2306066 A | 4/1997 |
| JP | 62082659 | 10/1988 |
| JP | 190000063162 | 11/1991 |
| JP | 04187738 | 7/1992 |
| JP | 08079186 A | 3/1996 |
| WO | WO/2006/065883 A2 | 9/1994 |
| WO | WO 99/45683 | 9/1999 |
| WO | WO 01/41346 A2 | 6/2001 |
| WO | WO 02/067521 A1 | 8/2002 |
| WO | WO 2002/082694 A1 | 10/2002 |
| WO | WO 02/091600 A2 | 11/2002 |
| WO | WO 2003/071731 A1 | 8/2003 |
| WO | WO 03/077423 A2 | 9/2003 |
| WO | WO 03/092237 A1 | 11/2003 |
| WO | WO 2004/008782 A2 | 1/2004 |
| WO | WO 2004/045078 A2 | 5/2004 |
| WO | WO 2004/088857 A2 | 10/2004 |
| WO | WO 2005/018134 A2 | 2/2005 |
| WO | WO 2005/050896 A2 | 6/2005 |

OTHER PUBLICATIONS

Wang, Zhigong et al., *Multi-Gb/s Silicon Bipolar Clock Recovery IC*, IEE Journal on Selected Areas in Communications, vol. 9, No. 5., Jun. 1991, pp. 656-663.

K-C Runge et al., "High-Speed Circuits for Lightwave Communications," 1999 World Scientific, pp. 181-184.

André et al.; *InP DHBT Technology and Design Methodology for High-Bit-Rate Optical Communications Circuits*; IEEE Journal of Solid-State Circuits; vol. 33, No. 9, Sep. 1998; pp. 1328-1335.

Borjak et al.; *High-Speed Generalized Distributed-Amplifier-Based Transversal-Filter Topology for Optical Communication Systems*;

IEEE Transactions on Microwave Theory and Techniques; vol. 45, No. 8; Aug. 1997; pp. 1453-1457.

Buchali et al.; *Fast Eye Monitor for 10 Gbit/s and its Application for Optical PMD Compensation*; Optical Society of America; (2000); pp. TuP5-1-TuP1-3.

Cartledge et al.; *Performance of Smart Lightwave Receivers With Linear Equalization*; Journal of Lightwave Technology; vol. 10, No. 8; Aug. 1992; ;pp. 1105-1109.

Chi et al.; *Transmission Performance of All-Optically Labelled Packets Using ASK/DPSK Orthogonal Modulation*; The 15th Annual Meeting of the IEEE Lasers and Electro-Optics Society, 2002; LEOS 2002; Nov. 10-14, 2002; vol. 1:51-52. The whole document.

Chiang et al.; *Implementation of STARNET: A WDM Computer Communications Network*; IEEE Journal on Selected Areas in Communications; Jun. 1996; vol. 14, No. 5; pp. 824-839.

Cimini et al.; *Can Multilevel Signaling Improve the Spectral Efficiency of ASK Optical FDM Systems?*; IEEE Transactions on Communications; vol. 41, No. 7; Jul. 1993; pp. 1084-1090.

Downie et al.; *Performance Monitoring of Optical Networks with Synchronous and Asynchronous Sampling*; Corning Incorporated, Science and Technology; SP-AR-02-1; p. WDD50-1; Abstract.

Enning et al.; *Design and Test of Novel Integrate and Dump Filter (I&D) for Optical Gbit/s System Applications*; Electronics Letters; (Nov. 21, 1991); vol. 27, No. 24; pp. 2286-2288.

Fürst et al.; *Performance Limits of Nonlinear RZ and NRZ Coded Transmission at 10 and 40 Gb/s on Different Fibers*; pp. 302-304.

Garrett, Ian; *Pulse-Position Modulation for Transmission Over Optical Fibers with Direct or Heterodyne Detection*; IEEE Transactions on Communications; vol. COM-31; No. 4; Apr. 1983; pp. 518-527.

Godin et al.; *A InP DHBT Technology for High Bit-rate Optical Communications Circuits*; IEEE; (1997); pp. 219-222.

Haskins et al.; *FET Diode Linearizer Optimization for Amplifier Predistortion in Digital Radios*; IEEE Microwave and Guided Wave Letters; vol. 10, No. 1; Jan. 2000; pp. 21-23.

Hranilovic et al.; *A Multilevel Modulation Scheme for High-Speed Wireless Infrared Communications*; IEEE; (1999); pp. VI-338-VI-341.

Idler et al.; *40 Gbit/s Quaternary Dispersion Supported Transmission Field Trial Over 86 km Standard Singlemode Fibre*; 24th European Conference on Optical Communication; Sep. 1998; pp. 145-147.

Jutzi, Wilhelm; *Microwave Bandwidth Active Transversal Filter Concept with MESFETs*; IEEE Transactions on Microwave Theory and Technique, vol. MTT-9, No. 9; Sep. 1971; pp. 760-767.

Kaess et al.; *New Encoding Scheme for High-Speed Flash ADC's*; IEEE International Symposium on Circuits and Systems; Jun. 9-12, 1997; Hong Kong; pp. 5-8.

Kaiser et al.; *Reduced Complexity Optical Duobinary 10-Gb/s Transmitter Setup Resulting in an Increased Transmission Distance*; IEEE Photonics Technology Letters; Aug. 2001; vol. 13; No. 8; pp. 884-886.

Lee et al.; *Effects of Decision Ambiguity Level on Optical Receiver Sensitivity*; IEEE Photonics Technology Letters; vol. 7, No. 19; Oct. 1995; pp. 1204-1206.

Marcuse, Dietrich; *Calculation of Bit-Error Probability for a Lightwave System with Optical Amplifiers and Post-Detection Gaussian Noise*; Journal of Lightwave Technology; vol. 9, No. 4; Apr. 1991; pp. 505-513.

Megherbi et al.; *A GaAs-HBT A/D Gray-Code Converter*; IEEE; (1997); pp. 209-212.

Nazarathy et al.; *Progress in Externally Modulated AM CATV Transmission Systems*; Journal of Lightwave Technology; vol. 11, No. 1; Jan. 1993; pp. 82-105.

Oehler et al.; *A 3.6 Gigasample/s 5 bit Analog to Digital Converter Using 0.3 μm AlGaAs-HEMT Technology*; IEEE; (1993); pp. 163-164.

Ohm et al.; *Quaternary Optical ASK-DPSK and Receivers with Direct Detection*; IEEE Photonics Technology Letters; Jan. 2003; vol. 15, No. 1; pp. 159-161.

Ohtsuki et al.; *BER Performance of Turbo-Coded PPM CDMA Systems on Optical Fiber*; Journal of Lightwave Technology; vol. 18; No. 12; Dec. 2000; pp. 1776-1784.

Ota et al.; *High-Speed, Burst-Mode, Packet-Capable Optical Receiver and Instantaneous Clock Recovery for Optical Bus Operation*; Journal of Lightwave Technology; vol. 12, No. 2; Feb. 1994; pp. 325-331.

Poulton et al.; *An 8-GSa/s 8-bit ADC System*; Symposium on VLSI Circuits Digest of Technical Papers; (1997); pp. 23-24.

Poulton et al.; *A 6-b, 4 GSa/s GaAs HBT ADC*; IEEE Journal of Solid-State Circuits; vol. 30, No. 10.; Oct. 1995; pp. 1109-1118.

Poulton et al.; *A 6-bit, 4 GSa/s ADC Fabricated in a GaAs HBT Process*; IEEE; (1994); pp. 240-243.

Prasetyo et al.; *Application for Amplitude Gain Estimation Techniques for Multilevel Modulation in OFDM Systems*; IEEE; (1998); pp. 821-824.

Shtaif et al.; *Limits on the Spectral Efficiency of Intensity Modulated Direct Detection Systems with Optical Amplifiers*; AT&T Labs Research; pp. MM1-1-MM1-3.

Su et al.; *Inherent Transmission Capacity Penalty of Burst-Mode Receiver for Optical Multiaccess Networks*; IEEE Photonics Technology Letters; vol. 6, No. 5; May 1994; pp. 664-667.

Vodhanel et al.; *Performance of Directly Modulated DFB Lasers in 10-Gb/s ASK, FSK, and DPSK Lightwave Systems*; Journal of Lightwave Technology; Sep. 1990; vol. 8, No. 9; pp. 1379-1386.

Vorenkamp et al.; *A 1 Gs/s, 10b Digital-to-Analog Converter*; ISSCC94/Session 3/Analog Techniques/Paper WP 3.3; pp. 52-53.

Wakimoto et al.; *Si Bipolar 2-GHz 6-bit Flash A/D Conversion LSI*; IEEE Journal of Solid-State Circuits; Dec. 1988; vol. 23, No. 6; pp. 1345-1350.

Walkin et al.; *A 10 Gb/s 4-ary ASK Lightwave System*; ECOC; 1997; pp. 255-258.

Walklin et al.; *Multilevel Signaling for Extending the Dispersion-Limited Transmission Distance in High-Speed, Fiber Optic Communication Systems*; IEEE; 1996; pp. 233-236.

Walklin et al.; *Multilevel Signaling for Increasing the Reach of 10 Gb/s Lightwave Systems*; IEEE Journal of Lightwave Technology; vol. 17; No. 11; Nov. 1999; pp. 2235-2248.

Webb, William T.; *Spectrum Efficiency of Multilevel Modulation Schemes in Mobile Radio Communications*; IEEE Transactions on Communications; vol. 43, No. 8; Aug. 1995; pp. 2344-2349.

Wedding et al.; *Multi-Level Dispersion Supported Transmission at 20 Gbit/s Over 46 km Installed Standard Singlemode Fibre*; 22nd European Conference on Optical Communication; 1996; pp. 91-94.

Wedding et al.; *Fast Adaptive Control for Electronic Equalization of PMD*; Optical Society of America; (2000); pp. TuP4-1-TuP4-3.

Westphal et al.; *Lightwave Communications*; 1994; Thursday Afternoon/CLEO '94; pp. 337-338.

Wilson et al.; *Predistortion of Electroabsorption Modulators for Analog CATV Systems at 1.55 μm*; Journal of Lightwave Technology; vol. 15, No. 9; Sep. 1997; pp. 1654-1662.

Author: Unknown; *Digital Carrier Modulation Schemes*; Title: Unknown; Date: Unknown; pp. 380-442.

Choi et al.; *A 0.18-μm CMOS 3.5-Gb/s Continuous-Time Adaptive Cable Equalizer Using Enhanced Low-Frequency Gain Control Method*; IEEE Journal of Solid-State Circuits; Mar. 2004; vol. 39, No. 3; pp. 419-425.

Paul, et al.; *3 Gbit/s Optically Preamplified Direct Detection DPSK Receiver With 116 photon/bit Sensitivity*; Electronics Letters; vol. 29, No. 7; Apr. 1, 1993; pp. 614-615.

Penninckx et al.; *Optical Differential Phase Shift Keying (DPSK) Direct Detection Considered as a Duobinary Signal*; Proc. 27th Eur. Conf. on Opt. Comm. (ECOC'01—Amsterdam); vol. 3; Sep. 30 to Oct. 4, 2001; pp. 456-457.

Rohde et al.; *Robustness of DPSK Direct Detection Transmission Format in Standard Fibre WDM Systems*; Electronics Letters; vol. 36, No. 17; Aug. 17, 2000; pp. 1483-1484.

Shirasaki et al.; *Fibre Transmission Properties of Optical Pulses Produced Through Direct Phase Modulation of DFB Laser Diode*; Electronics Letters; vol. 24, No. 8; Apr. 14, 1988; 486-488.

International Search Report for PCT Application No. PCT/US03/35887 dated Jun. 4, 2004.

Weger et al.; *Gilbert Multiplier as an Active Mixer with Conversion Gain Bandwidth of up to 17GHz*; Electronics Letters; Mar. 28, 1991; vol. 27, No. 7; pp. 570-571.

Kannangara et al.; *Adaptive Duplexer for Multiband Transreceiver*; Radio and Wireless Conference; Aug. 10-13, 2003; RAWCON '03; pp. 381-384.

Kannangara et al.; *Adaptive Duplexer for Software Radio*; Approximate Date: Nov. 11-13, 2002.

Kannangara et al.; *An Algorithm to Use in Adaptive Wideband Duplexer for Software Radio*; IEICE Transactions on Communications; Dec. 2003; vol. E86-B, No. 12; pp. 3452-3455.

Kannangara et al.; *Performance Analysis of the Cancellation Unit in an Adaptive Wideband Duplexer for Software Radio*; ATcrc Telecommunications and Networking Conference & Workshop, Melbourne, Australia, Dec. 11-12, 2003.

Williamson et al., *Performance Analysis of Adaptive Wideband Duplexer*; 2003 Australian Telecommunications, Networks and Applications Conference (ATNAC); Dec. 8-10, 2003.

\* cited by examiner

MULTI-LEVEL SIGNAL CLOCK RECOVERY TECHNIQUE

PRIORITY AND RELATED APPLICATIONS

The present application claims priority to provisional patent application entitled, "MULTI-LEVEL SIGNAL CLOCK RECOVERY TECHNIQUE," filed on Feb. 15, 2002 and assigned U.S. application Ser. No. 60/357,362. The entire contents of this provisional application are hereby incorporated by reference.

TECHNICAL FIELD

The present invention relates to high speed communications. More particularly, the present invention relates to a system and method for recovering clock signals from multi-level signals in high speed optical and electrical communications.

BACKGROUND OF THE INVENTION

In order to obtain increase spectral efficiency and therefore increased data throughput for both optical and electrical data transport systems, complex modulation schemes, such as multilevel (ML) signaling, are desired by the communications industry for both electrical and optical domain applications. Clock recovery of the resulting complex waveforms can be difficult, but is critical for data recovery.

Conventional telecommunication clock-recovery (CR) integrated circuits (IC's) are generally only designed for use with binary non-return-to-zero (NRZ) (or equivalently On-Off-Keyed, OOK, waveforms). Conventional CR IC's may employ comparators to determine the clock signal from the multi-level signal. Such an approach usually does not detect a high percentage of the transitions of a multilevel signal that are important to determine the clock signal.

Other conventional clock recovery units directly process multilevel signals to recover the clock signals. However, such units are not useful in the high speed communications environment because of the processing time needed by these conventional units to extract the clock signals from the multi-level signals.

In yet another conventional approach, processing of the multi-level signal is focused on the middle of the multi-level signal and not the edges of the signal. More precisely, the slopes and amplitudes at the temporal decision points of the multilevel signals are examined to align the recovered clock so as to minimize an estimated sampling error. Such an approach focuses on minute signal amplitude variations, where the signal is expected to be flat, rather than major signal transitions, where the signal amplitude should generally experience major changes. The latter property is more indicative of the underlying clock. Also, usually in this conventional approach, the method involves decoding signal values prior to clock recovery. Such decoding is subject to decoding errors.

In view of the foregoing, there is a need in the art for efficiently detecting clock signals in a multilevel signal. There is a further need in the art for a system and method to determine clock signals from a multilevel signal in high speed communication applications.

SUMMARY OF THE INVENTION

This invention offers an efficient method for recovering the clock or equivalently the symbol timing information of very high-speed ML waveforms. It can be particularly applicable to the clock recovery of ML signals within the receivers of high-speed telecommunication systems.

An ideal clock recovery approach usually synchronizes the rising (or falling) edge of the clock to the transitions of the ML signal. Signal transitions are usually defined as the process of the signal changing from one symbol (or level) to another.

Clock recovery of a multi-level signal can be performed in a two-step process. First, the transitions within the ML signal can be detected by a novel transition detector (TD). And second, the output of the TD circuit can comprise a pseudo-non-return-to-zero (pNRZ) signal that can drive a conventional OOK clock recovery (CR) IC. The NRZ signal is referred to as pNRZ because it can lack meaningful data content.

One objective of the TD circuit is to convert the edges of the signal into the pseudo-NRZ (pNRZ) signal for subsequent processing by a standard NRZ OOK clock recovery IC. It is desired to capture as many transitions as possible to allow the conventional NRZ clock recovery (CR) chip to optimally perform. In practice, NRZ clock recovery chips can lock to OOK NRZ data streams with reasonably diminished transition density (such as on the order of $1/10$ to $1/100$), but their locking performance can sometimes suffer.

An ideal transition detector can produce an output that inverts on every transition of the ML data stream. Since the pNRZ signal is generated in order to recover the clock, it is reasonable to assume that the clock does not exist for the TD function and therefore, the TD circuit is probably an analog and/or asynchronous function.

Another important feature of the present invention is that a ML signal Vin can be differentiated. This differentiated signal can be zero when the signal is flat (e.g. in the middle of the data symbol or when two adjacent symbols are the same) and large in magnitude when a transition occurs. Whether the derivative is positive or negative (corresponding to upward or downward transitions) can be immaterial since one objective of the present invention is simply to detect the transition and not its direction.

Consequently, the invention can threshold the absolute value of the derivative instead of the signed derivative, unlike many conventional clock recovery techniques known in the art that use the sign, positive or negative, of the slope around a nominal sampling point to determine whether a clock should be advanced or delayed.

The present invention evaluates the edges of the multi-level signals rather than flat regions in the center of the decision timing of the multi-level signals. And unlike conventional clock recovery techniques that require decoding of the multilevel signals prior to recovering the clock signal, the present invention can operate without decoding any of the multi-level signals prior to clock recovery. In other words, the present invention recovers clock signals with an analog process that is unlike many conventional clock recovery techniques that digitize multilevel signals prior to recovering any clock signals.

The present invention can use the derivative of the ML signal for detection of the ML signal's transitions. The ML input signal, Vin, can be differentiated in order to produce a waveform that can be labeled dVin/dt. The differentiated signal can drive two comparators with thresholds set to Vref+ and Vref−. The comparators can produce two outputs that can be labeled "Up" and "Down", which will become true as the signal, Vin, moves up or down, respectively.

When the signal rises, a positive derivative is present. The upper comparator with threshold set to Vref+ can assert an "Up" output. Similarly, when the input signal falls, a negative derivative is present and the lower comparator can assert a "Down" output. These two outputs labeled "Up" and "Down" are then combined to produce the necessary pNRZ output.

The rising edges of the "Up" and "Down" signals can be "captured" with two toggle flip-flops (T-FF's). The T-FF's can simply invert their outputs on every rising edge from the comparators. The output of the T-FF's can be exclusive OR'ed (XOR'ed) together to produce the desired pNRZ signal. An XOR function will usually invert its output, if the state of either input changes provided the other input remains constant. Since Vin cannot move both up and down simultaneously, a rising edge occurring from either "Up" or "Down" will usually result in an inversion of the TD output. This can represent the ideal pNRZ signal generation as discussed above.

DETAILED DESCRIPTION OF EXEMPLARY EMBODIMENTS

Figure 1:
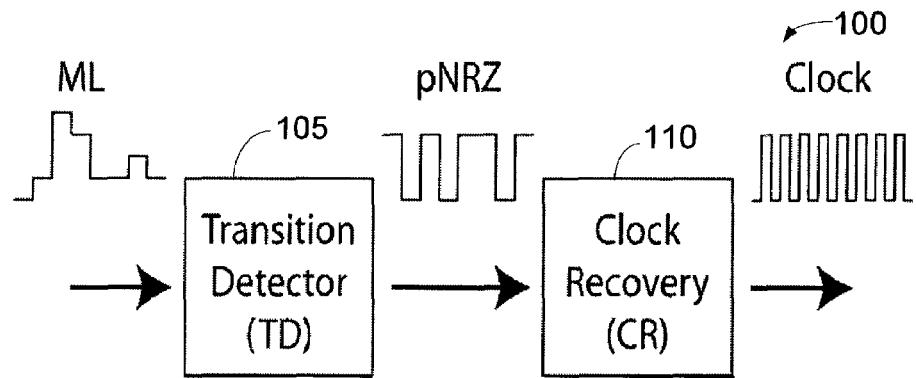
FIG. 1 is a block diagram of an exemplary multilevel clock recovery system according to an exemplary embodiment of the present invention.

Clock recovery of a multi-level (ML) signal can be performed in a two-step process. First, the transitions within the ML signal can be detected by a novel transition detector (TD). And second, the output of the TD circuit can comprise a pseudo-non-return-to-zero (pNRZ) signal that can drive a conventional OOK clock recovery (CR) IC. The TD circuit can convert the edges of the ML signal into the pseudo-NRZ (pNRZ) signal. The TD circuit can capture as many transitions as possible to allow the conventional NRZ clock recovery (CR) chip to optimally perform. The TD circuit can differentiate the ML signal in order to detect the ML signal's transitions.

An exemplary transition detection circuit has been built by the inventors and simulated to operate at 2.7 Giga Symbols per second (Gsym/sec) in a Gallium Arsenide (GaAs) heterojunction bi-polar transistor (HBT) process. In other words, the inventors have fabricated a working model of the present invention. The present invention can also be readily adapted to a variety of other semiconductor processes such as Complimentary Metal Oxide Semiconductor (CMOS) or Silicon Germanium (SiGe) as is apparent to one of ordinary skill in the art.

Referring now to the drawings, in which like numerals represent like elements throughout the several Figures, aspects of the present invention and the illustrative operating environment will be described.

Referring to FIG. 1, this Figure is a block diagram of an exemplary multilevel clock recovery system 100 according to an exemplary embodiment of the present invention. The clock recovery system 100 can comprise a transition detector (TD) 105 and a conventional clock recovery unit (CR) 110 that can process OOK type signals. The output of the TD circuit 105 can comprise a pseudo-non-return-to-zero (pNRZ) signal that can drive the conventional OOK clock recovery (CR) IC 110. The NRZ signal is referred to as pNRZ because it can lack meaningful data content.

Figure 2:
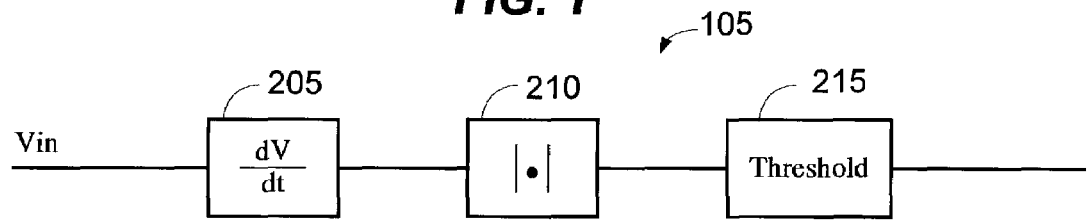
FIG. 2 is a block diagram illustrating some key functions of the transition detector circuit according to one exemplary embodiment of the present invention.

Referring now to FIG. 2, this Figure is a block diagram illustrating some key functions of the transition detector circuit 105 according to one exemplary embodiment of the present invention. The transition detector circuit 105 can comprise three stages: a derivative stage 205, an absolute value of the derivative stage 210, and a threshold comparison stage 215.

Figure 3:
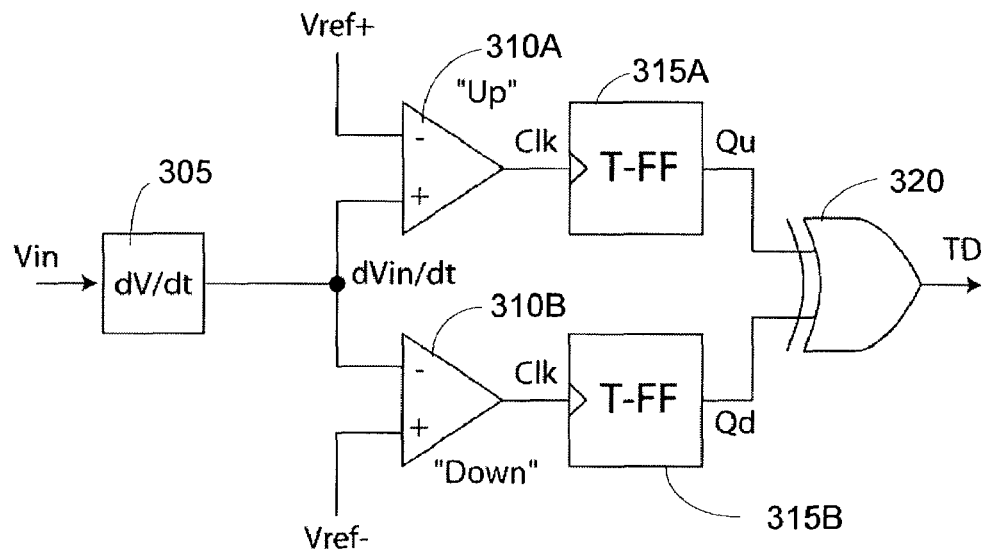
FIG. 3 is a block diagram illustrating exemplary elements of the transition detector circuit according to one exemplary embodiment of the present invention.

Referring now to FIG. 3, this Figure is a block diagram illustrating exemplary elements of the transition detector circuit 105 according to one exemplary embodiment of the present invention. The ML input signal, Vin, can be differentiated by a differentiator 305 in order to produce a waveform that can be labeled dVin/dt. The differentiated signal can drive two comparators 310A, 310B with thresholds set to Vref+ and Vref−. The comparators 310A, 310B can produce two outputs that can be labeled "Up" and "Down", which will become true as the signal, Vin, moves up or down, respectively.

When the signal rises, a positive derivative is present. The upper comparator 310A with threshold set to Vref+ can assert an "Up" output. Similarly, when the input signal falls, a negative derivative is present and the lower comparator 310B can assert a "Down" output. These two outputs labeled "Up" and "Down" are then combined via an exclusive "OR" function 320 to produce the necessary pNRZ output.

The rising edges of the "Up" and "Down" signals can be "captured" with two toggle flip-flops (T-FF's) 315A, 315B. The T-FF's 315A, 315B simply invert their outputs on every rising edge from the comparators. The output of the T-FF's 315A, 315B can be exclusive OR'ed (XOR'ed) together at 320 to produce the desired pNRZ signal. An XOR function 320 will invert its output, if the state of either input changes provided the other input remains constant. Since Vin cannot move both up and down simultaneously, a rising edge occurring from either "Up" or "Down" will result in an inversion of the TD output. This can represent an ideal pNRZ signal generation.

Figure 4:
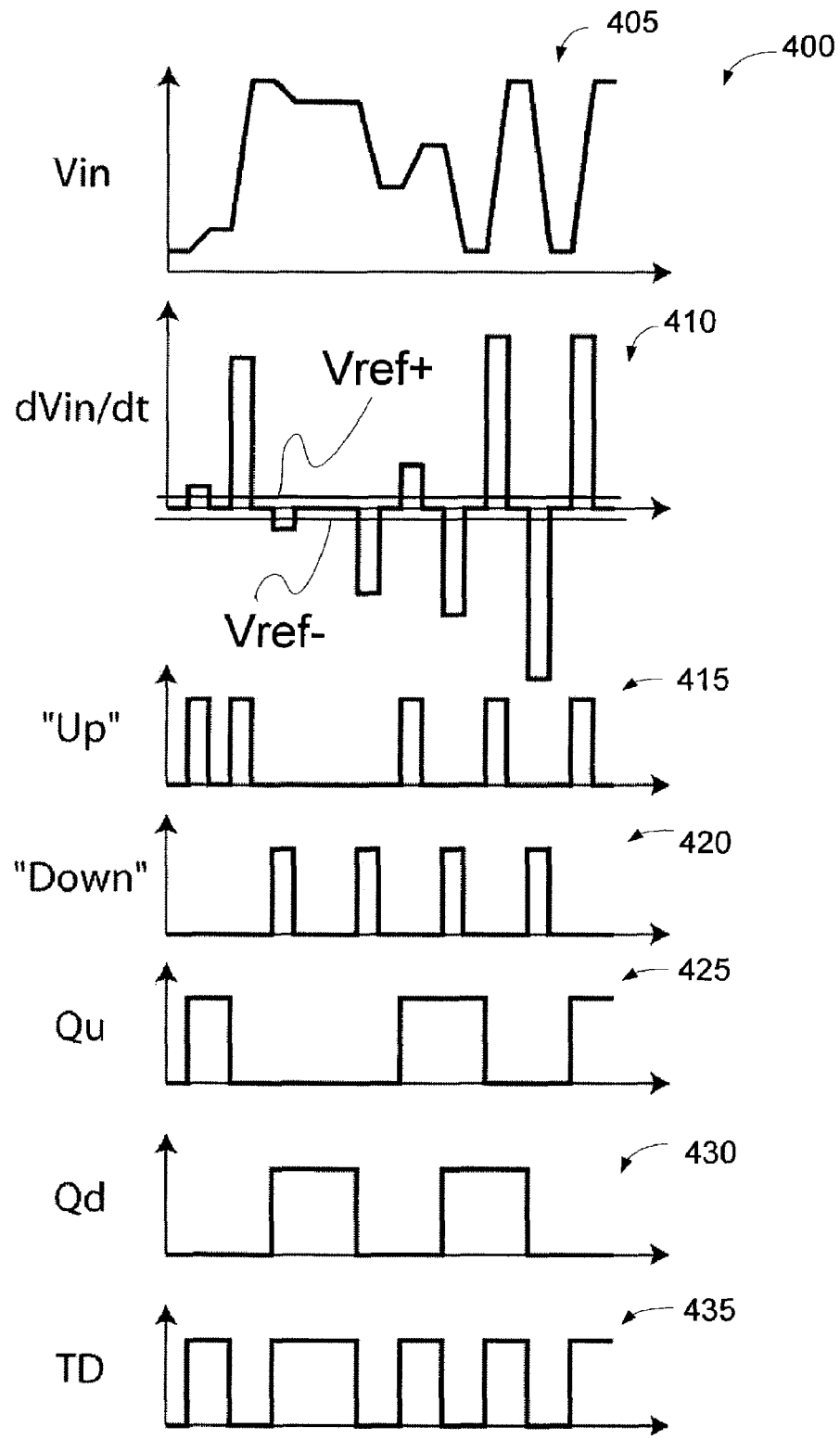
FIG. 4 is a series of graphs illustrating idealized waveforms for the operation of the exemplary transition detector circuit illustrated in FIG. 3.

Referring now to FIG. 4, this Figure is a series 400 of seven graphs 405–435 illustrating idealized waveforms for the operation of the exemplary transition detector circuit 105 illustrated in FIG. 3. The first graph 405 illustrates the multilevel signal input into the transition detector circuit 105.

The second graph 410 illustrates a derivative of the multilevel signal from the first graph 405. The third graph 415 illustrates an output of the first comparator 310A. Meanwhile, the fourth graph 420 illustrates an output of the second comparator 310B. The fifth graph 425 illustrates an output of the first toggle flip-flop 315A. And the sixth graph 430 illustrates an output of the second toggle flip-flop 315B. The seventh graph 435 illustrates the output of the exclusive "or" function 320.

Figure 5:
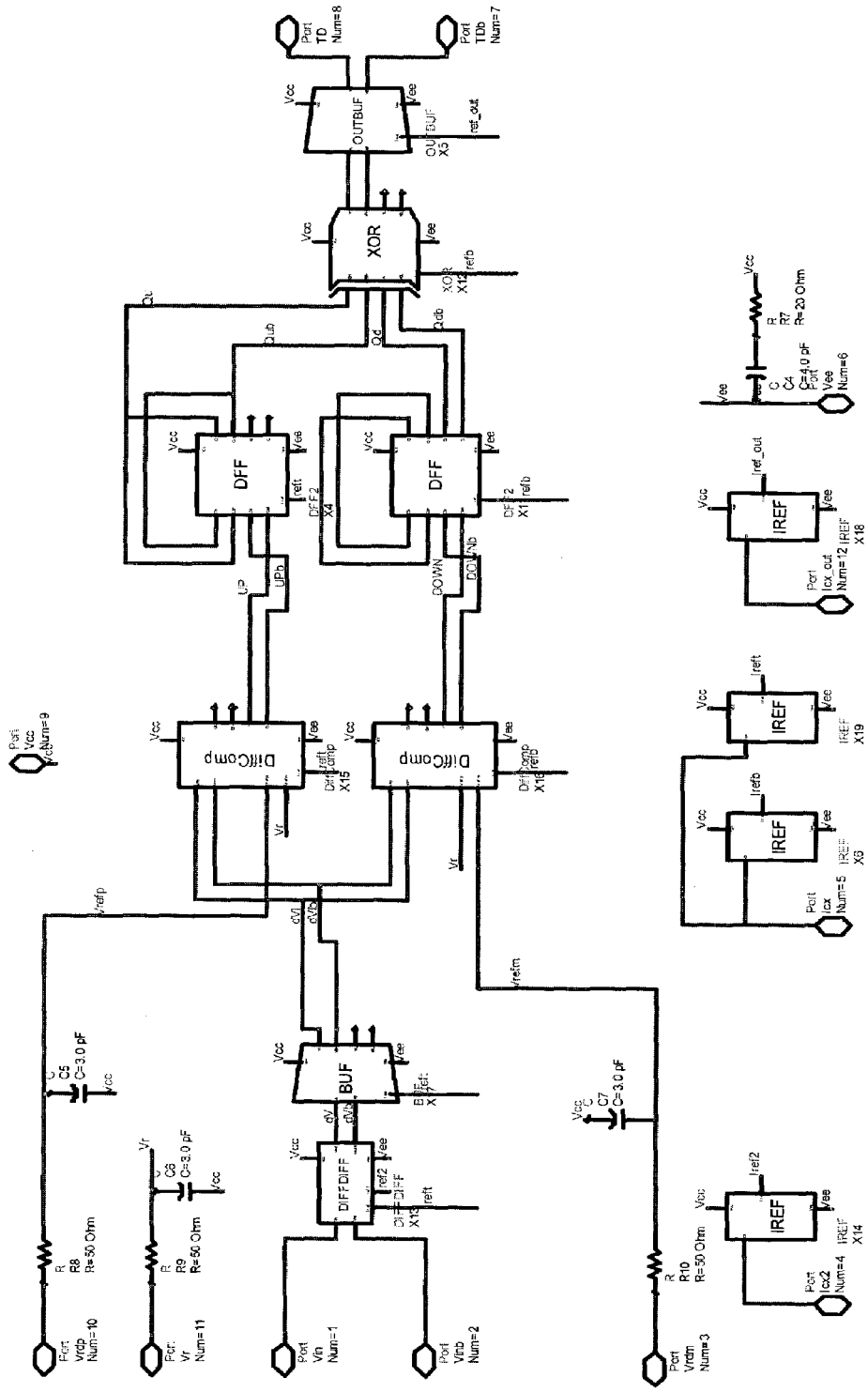
FIG. 5 is a top-level schematic for an exemplary transition detector circuit shown in FIG. 3.

FIG. 5 illustrates the top-level schematic for the exemplary transition detector illustrated in FIG. 3. The circuit is a fully differential design and is functionally identical to the block diagram of FIG. 3. The differentiation function is performed by the circuit block labeled DIFFDIFF (X13) (differential differentiator). The differentiated signal is amplified by a simple differential limiting amplifier, X17.

The differential output of the limiting amplifier is routed to two differential comparators that have thresholds set by the voltages at the input pins Vrdp, Vrdm, and the common reference pin Vr. The differential outputs from the comparators toggle two T-FF's that are made from two D-FF's (X4 and X11). The differential outputs of the FF's are XOR'ed by a differential XOR gate, X12. Finally, the output of the XOR gate is buffered by an OUTBUF circuit, which provides appropriate drive for the OOK CR IC.

Figure 6:
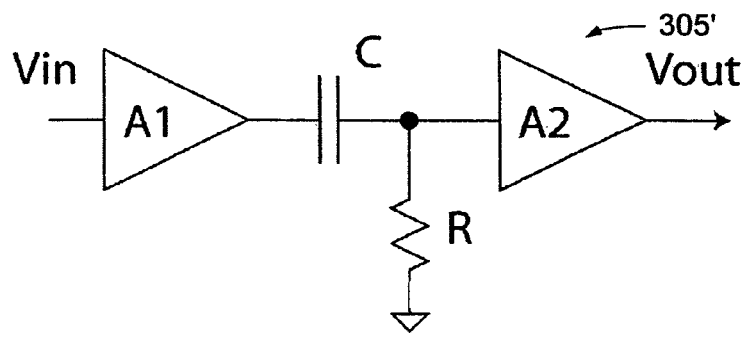
FIG. 6 is a block diagram of a series-C based differentiator circuit according to one exemplary embodiment of the present invention.

The differential differentiator circuit employs a novel approach as described below. Differentiation can be accomplished by a variety of methods. An exemplary differential differentiator 305' is illustrated in FIG. 6. In this approach an amplifier, A1, with a low output impedance, drives a series-connected RC network. The resistor R combined with the output impedance of the amplifier must be low enough to force an accurate representation of the input signal across the capacitor. Then, the resulting current through the capacitor will be the derivative of the input voltage (with a possible gain/loss factor). That is, for an ideal capacitor:

$$I = C\frac{dV}{dt}. \quad (1)$$

The voltage across the resistor, R, will be directly proportional to this current (Ohm's law). Therefore, if the input amplifier has a gain G1 and the output amplifier a gain G2, the circuit's transfer function will be:

$$V_{out} = G1G2RC\frac{dV_{in}}{dt} \quad (2)$$

provided that the input voltage is appropriately impressed across the capacitor, C. In order for the input voltage to appear across the capacitor, the RC cutoff frequency must be much greater than the operating frequency:

$$f_{op} << \frac{1}{2\pi C(R + R_{out1})}, \quad (3)$$

in which $R_{out1}$ is the output impedance of amplifier A1; and A2 is assumed to have a high input impedance. Equation (3) indicates that the RC product must be small for high frequency operation ($f_{op}$).

Therefore, the amplifier gains, G1 and G2, must be large to offset the signal loss as per Equation (2). The approach illustrated in FIG. 6 and described above is not a preferred exemplary embodiment because useful circuit function requires large gain and/or a low impedance amplifier to drive the RC network.

Figure 7:
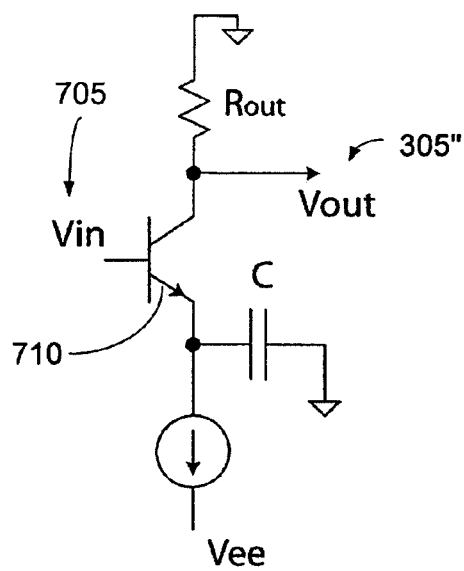
FIG. 7 is a schematic of an exemplary differentiator circuit according one preferred exemplary embodiment of the present invention.

Referring now to FIG. 7, a preferred and exemplary embodiment of an exemplary differentiator 305" is illustrated in FIG. 7. For this exemplary embodiment, a shunt capacitor C is directly connected to the output of a low impedance emitter follower 705. The relevant RC time constant is simply the output resistance of the emitter follower 705 and the capacitance, C. Since the output impedance of an emitter follower can be designed to be very low, the RC bandwidth for impressing the voltage across the capacitor C can be very high.

The emitter follower 705 is further designed to have a collector resistance from which the output is derived. The capacitor, C, is charged through the transistor 710 and therefore the current through $R_{out}$ is an identical representation (ignoring the transistor's finite β and an offset current) of the current in the capacitor C. By inspection, the output voltage, Vout, is as follows:

$$V_{out} \cong -RI_o - R_{out}C\frac{d(V_{in} - V_{off})}{dt} \quad (4)$$

where $I_o$ is the DC bias current and $V_{off}$ is an input offset due primarily to $V_{be}$. An important aspect of Equation (4) is that $R_{out}$ can be set arbitrarily large (determined by the subsequent circuit load) so that the circuit can represent significant gain as compared to the basic conventional approach described earlier.

The offsets involved in Equation (4) are undesirable, but they are both approximately constant. The variable $I_o$ is set by a current source and $V_{off}$ is approximately $V_{be}$. Additionally, a fully differential design, as described below, eliminates these offsets.

Figure 8:
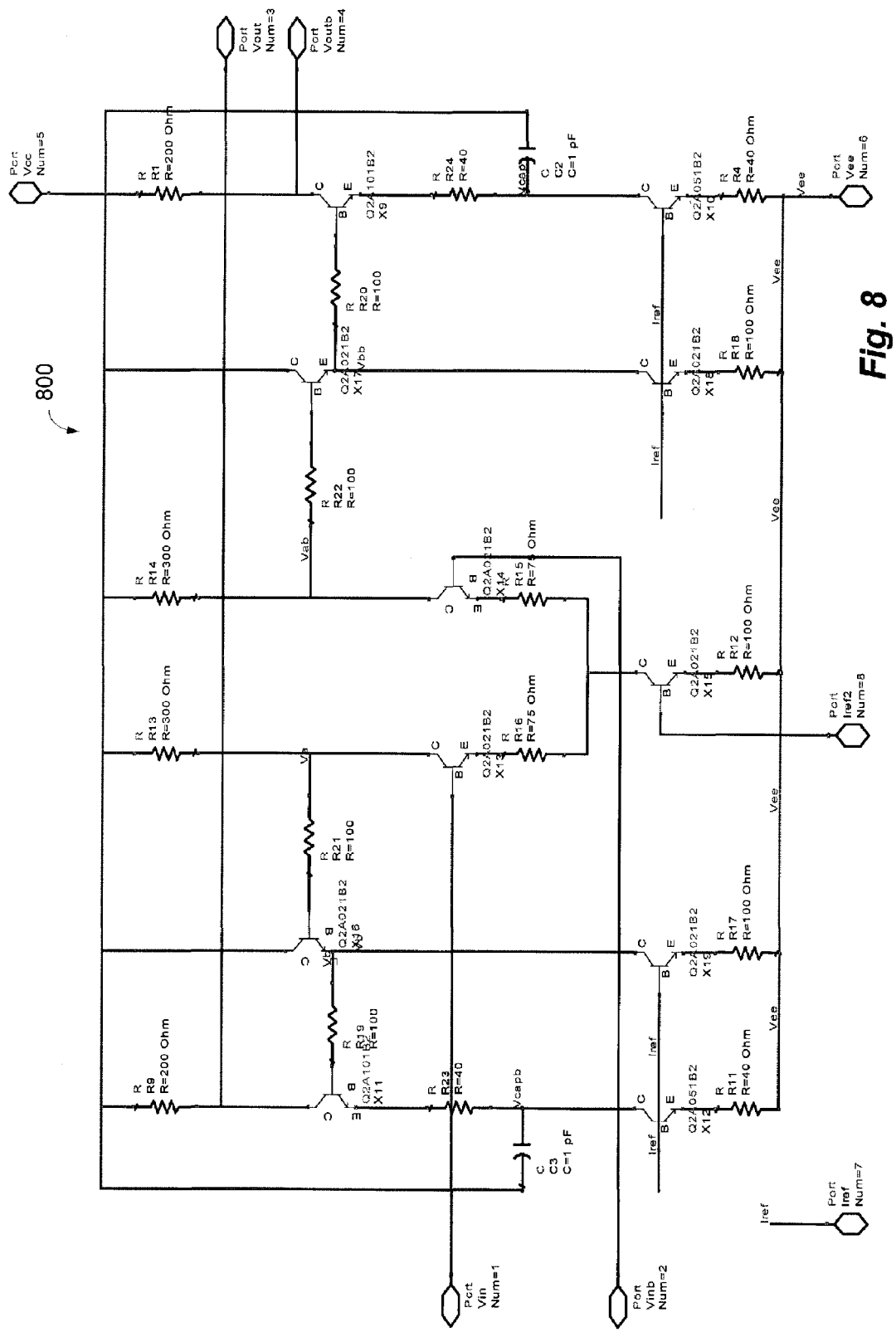
FIG. 8 is a schematic diagram of an exemplary differential differentiator (DIFFDIFF) circuit according to one exemplary embodiment of the present invention.

Referring now to FIG. 8, a transistor level schematic diagram of an exemplary differentiator circuit (DIFFDIFF) 800 is illustrated. This circuit, though complex at first inspection, generally comprises two of the basic circuits shown in FIG. 7 operated differentially. The input is first differentially buffered by the differential input amplifier comprising X13 and X14. The differential outputs of this amplifier drive two emitter follower stages (each) comprising X11, X16 and X17, X9. The low impedance output of the emitter followers accurately impresses the input voltage across capacitors C3 and C2. These capacitors could be replaced by one differentially connected capacitor between the two emitter follower outputs. Such a connection assumes perfect symmetry of the amplifiers, and simulation suggests improved operation by using the equivalent split capacitor approach as shown. The resistors R23 and R24 were added to help stabilize the emitter follower amplifiers—it is well known that capacitive loads can cause instabilities with emitter follower amplifiers. The differential output is obtained from the collector resistors R9 and R1.

Figure 9:
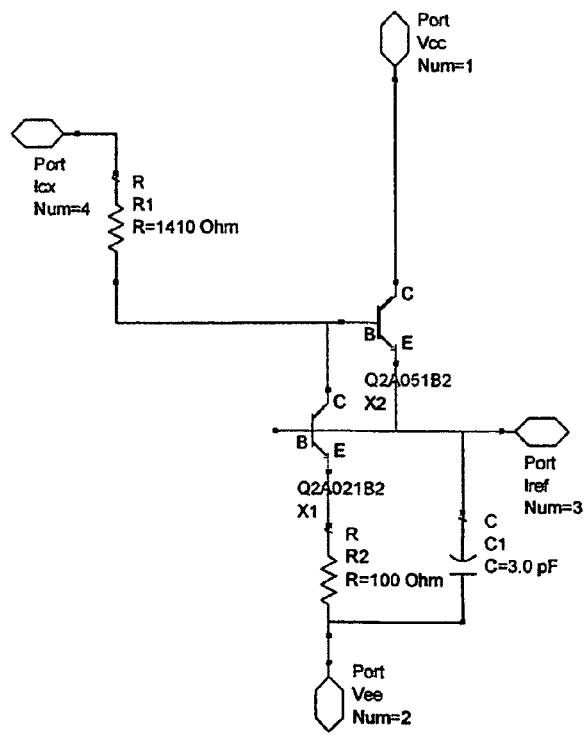
FIG. 9 is a schematic diagram of an exemplary current reference circuit according to one exemplary embodiment of the present invention.

Referring now to FIG. 9, this figure illustrates exemplary current reference circuit 900 used to control the bias of the differential differentiator circuit. This circuit can comprise a "Beta-helper"-type current reference source. In other words, this circuit 900 provides a current reference for all of the current sources at bottom of FIG. 8.

Specifically, the current reference source circuit 900 can provide current for the lowest row of transistors illustrated in FIG. 8. The present invention is not limited to this type of current reference source 900 illustrated in FIG. 9. Other current reference source circuits are known in the art and are not beyond the scope and spirit of the present invention.

Figure 10:
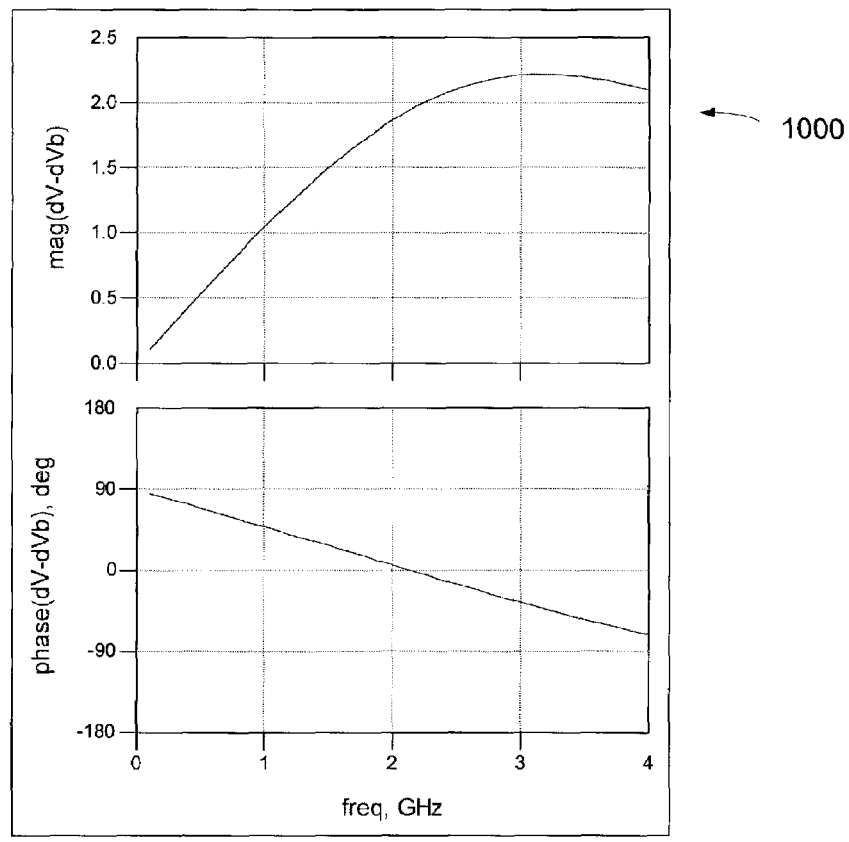
FIG. 10 is a series of graphs illustrating a simulation of the frequency response of the exemplary differentiator circuit illustrated in FIG. 8.

Referring now to FIG. 10, a significant issue with the use of differentiators is that they have a frequency response that increases linearly with frequency. This has a tendency to amplify noise of the input signal. Therefore, a differentiator should ideally only operate over a bandwidth that matches the input signal. FIG. 10 illustrates a simulation 1000 of the frequency response of the differentiator circuit. The ideal frequency response of a differentiator is simply $j\omega$ (The Fourier transform of dV/dt is $j\omega F(V)$). The simulation in Figure 10 shows a linear amplitude response up to approximately 2 GHz with a linear phase response starting at 90 degrees as expected at low frequencies.

The linear slope of the phase response is simply due to the delay through the circuit and has no consequence for normal operation (The Fourier transform of a time delay is a linear phase offset). The response is seen to peak at slightly over 3 GHz and was observed to roll off gracefully at higher frequencies.

Figure 11:
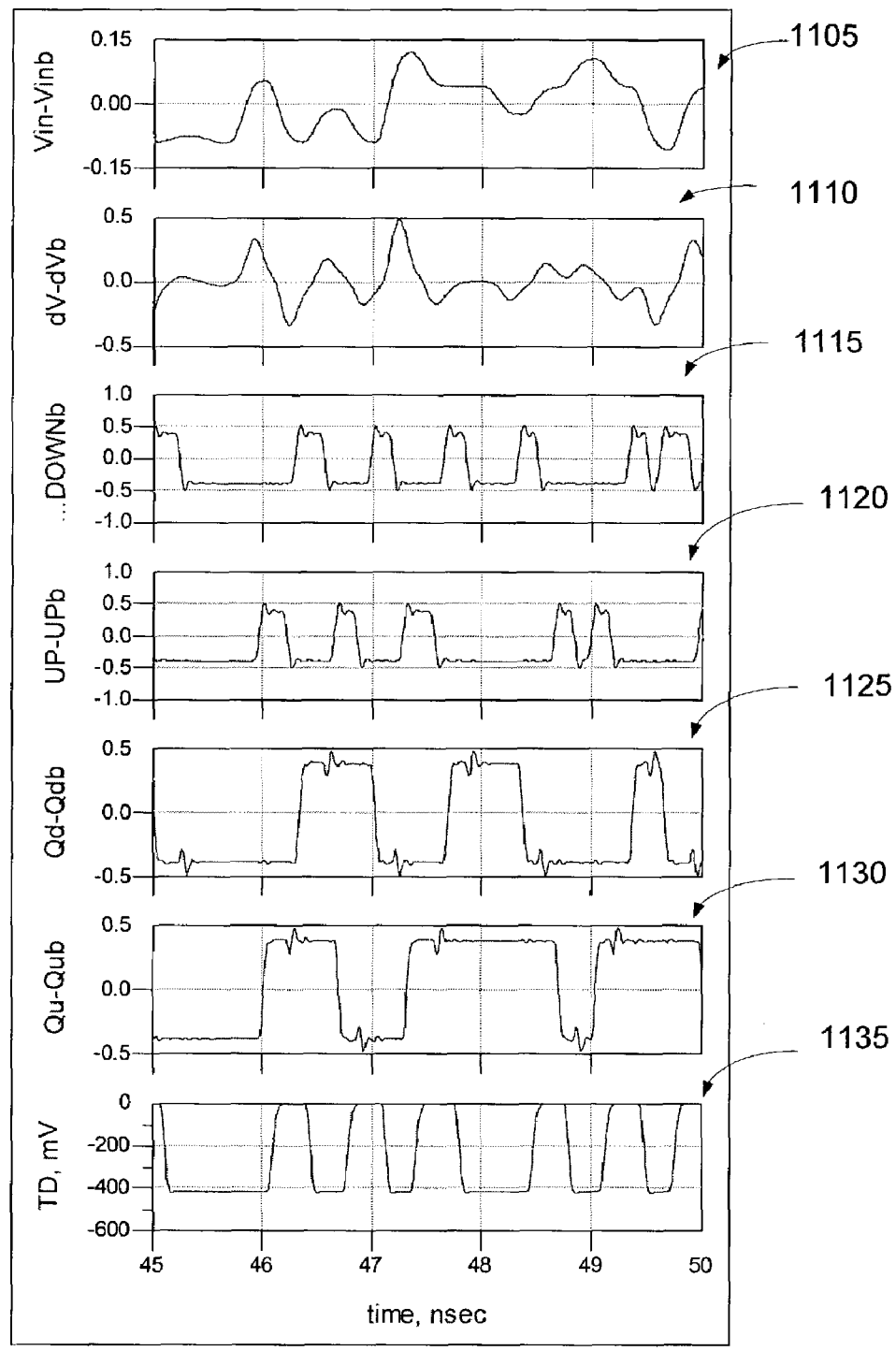
FIG. 11 a series of graphs illustrating simulated waveforms for the operation of an exemplary transition detector circuit according to one exemplary embodiment of the present invention.

Referring now to FIG. 11, this Figure illustrates a result of a simulation of the complete TD circuit driven 105 by an ML signal. FIG. 11 includes a series of graphs 1100 that are similar to the graphs of FIG. 4. However, FIG. 11 illustrates a simulated multi-level signal instead of an idealized multilevel signal that is illustrated in FIG. 4.

FIG. 11 also demonstrates that the transition circuit 105 catches almost all transitions as predicted. The first graph 1105 illustrates the multilevel signal input into the transition detector circuit 105.

The second graph 1110 illustrates a derivative of the multilevel signal from the first graph 1105. The third graph 1115 illustrates an output of the first comparator 310A. Meanwhile, the fourth graph 1120 illustrates an output of the second comparator 310B. The fifth graph 1125 illustrates an output of the first toggle flip-flop 315A. And the sixth graph 1130 illustrates an output of the second toggle flip-flop 315B. The seventh graph 1135 illustrates the output of the exclusive "or" function 320.

Figure 12:
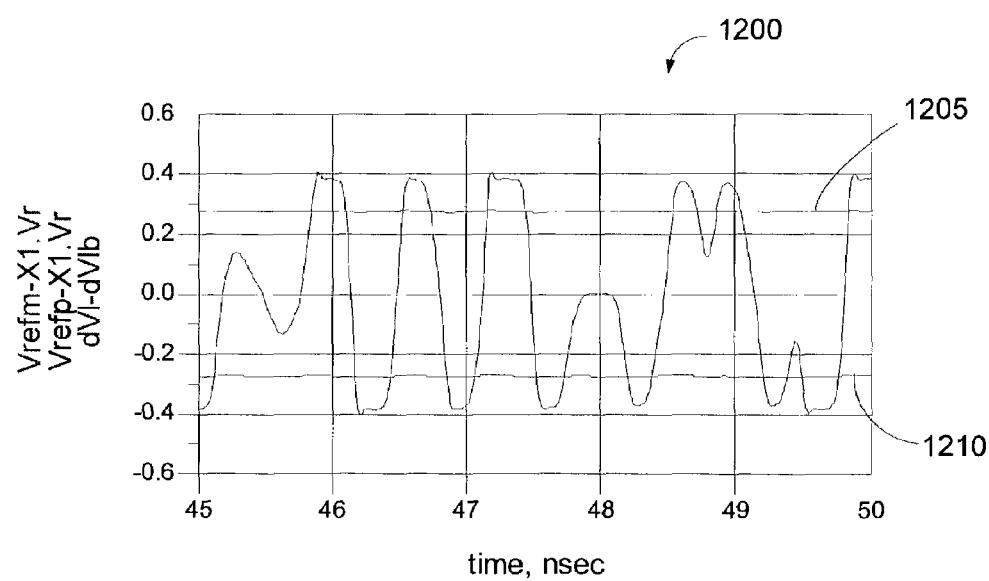
FIG. 12 is a diagram illustrating a waveform for the derivative threshold point in an exemplary transition detector circuit according to exemplary embodiment of the present invention.

Referring now to FIG. 12, this figure illustrates detail of the comparator process. In other words, this Figure illustrates a waveform 1200 and the derivative threshold points 1205, 1210 according to an exemplary transition detector circuit 105.

Figure 13:
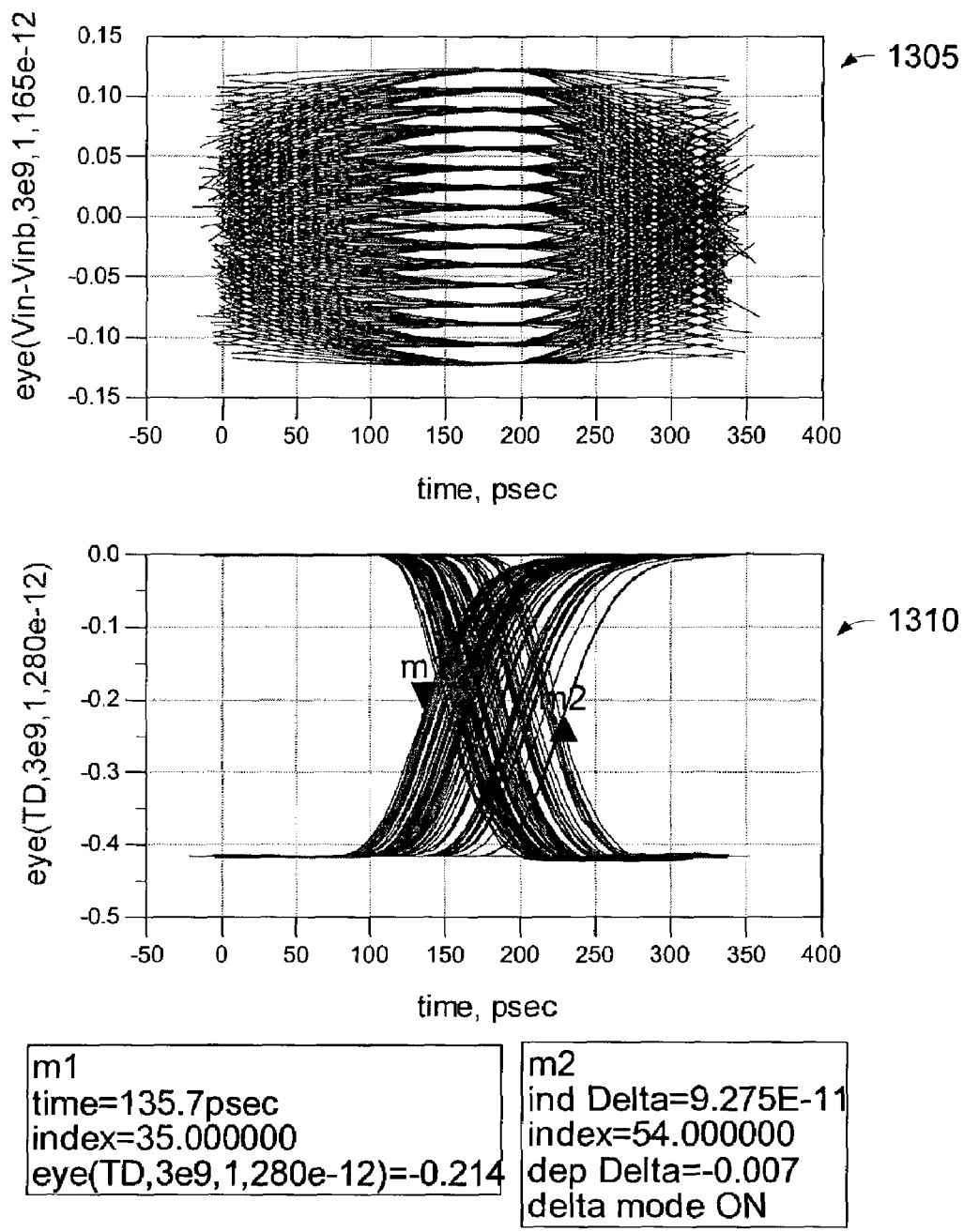
FIG. 13 is an illustration of a simulated eye-diagram and output diagram for an exemplary transition detector circuit according to one exemplary embodiment of the present invention.

Referring now to FIG. 13, this Figure is a series of graphs that summarizes the overall circuit performance of the transition detection circuit 105. The first graph 1305 comprises an eye diagram of the TD output that will be fed to an OOK CR chip. Reasonable jitter width is observed and much of this jitter can be suppressed by the subsequent OOK CR IC's jitter rejection properties. The second graph 1310 illustrates the output of the transition detection circuit 105.

From FIG. 13, one skilled in the art will recognize that the recovered signal, while giving a better result than without the use of the TD, exhibits what is known as deterministic jitter (DJ). DJ is temporal variability in the transition location due to patterns in the data sequence.

Figure 14A:
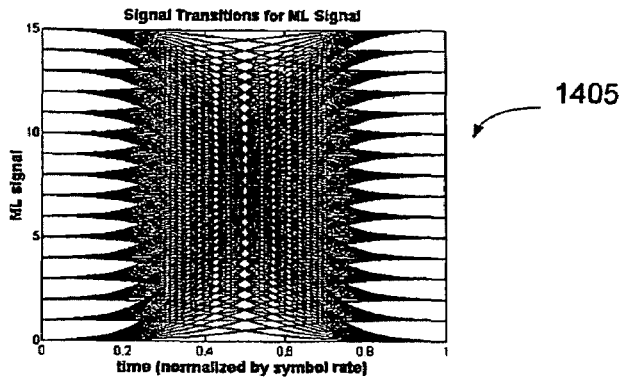
FIG. 14 is a series of graphs illustrating the deterministic jitter that can be introduced by the transition detection method illustrated FIG. 3.
Figure 14B:
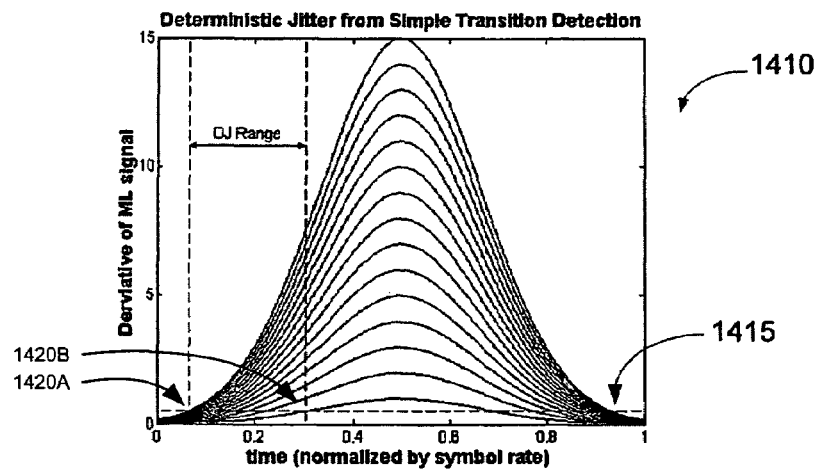

FIG. 14 illustrates the source of this DJ. FIG. 14(a) illustrates an exemplary eye-diagram 1405 of a ML signal with 16 levels. FIG. 14(b) illustrates exemplary corresponding absolute values 1410 of the derivatives of the signals illustrated in FIG. 14(a). The only difference among the fifteen derivatives in FIG. 14(b) is their amplitude, i.e. they are all scalings of a single function. The dashed horizontal line 1415 in FIG. 14(b) illustrates the transition threshold Vref used.

The location where this horizontal line crosses a particular derivative is a respective declared transition point 1420A, 1420B. While only two declaration transition points 1420A, 1420B are labeled in FIG. 14(b), those skilled in the art will appreciate that thirteen additional declarations transition points are not labeled but do exist and correspond to the remaining thirteen derivatives.

As is evident from FIG. 14(b), this declaration point occurs earlier for larger level transitions. Due to this variability, jitter is introduced by the TD circuit and can degrade performance of subsequent circuitry making use of the recovered clock. While CR following the TD circuit will reduce this DJ, the CR may not be able to remove all the DJ. Furthermore, in the presence of additional random jitter and DJ from other sources, the CR may not be able to fully compensate for their aggregate effect.

Figure 15:
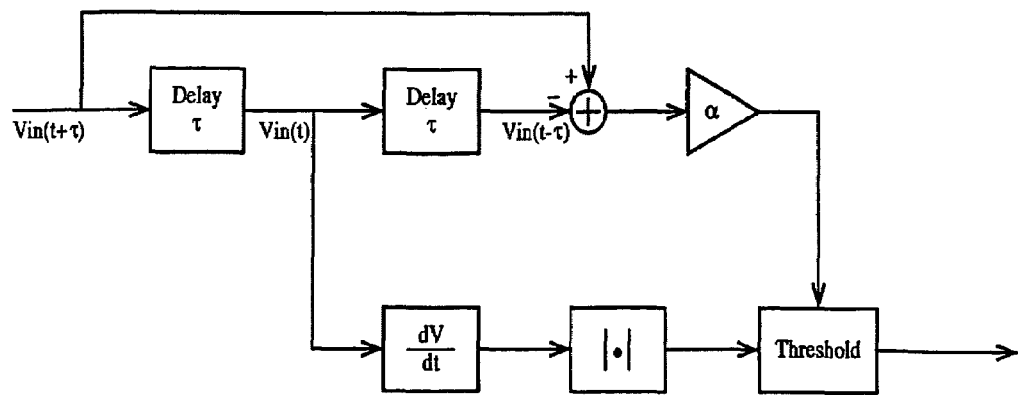
FIG. 15 is a block diagram of illustrating a detection method to remove deterministic jitter according to one exemplary embodiment of the present invention.

The DJ illustrated in FIG. 14 is due to sensitivity to data patterns. It is important to note that the DJ is not due to noise. Thus, it is theoretically possible to remove the DJ with appropriate methods. FIG. 15 shows a block diagram extending the functionality in FIG. 2 to remove DJ. The constant threshold transition detection (CTTD) of FIG. 2 is actually included as a subset of FIG. 15.

Figure 16:
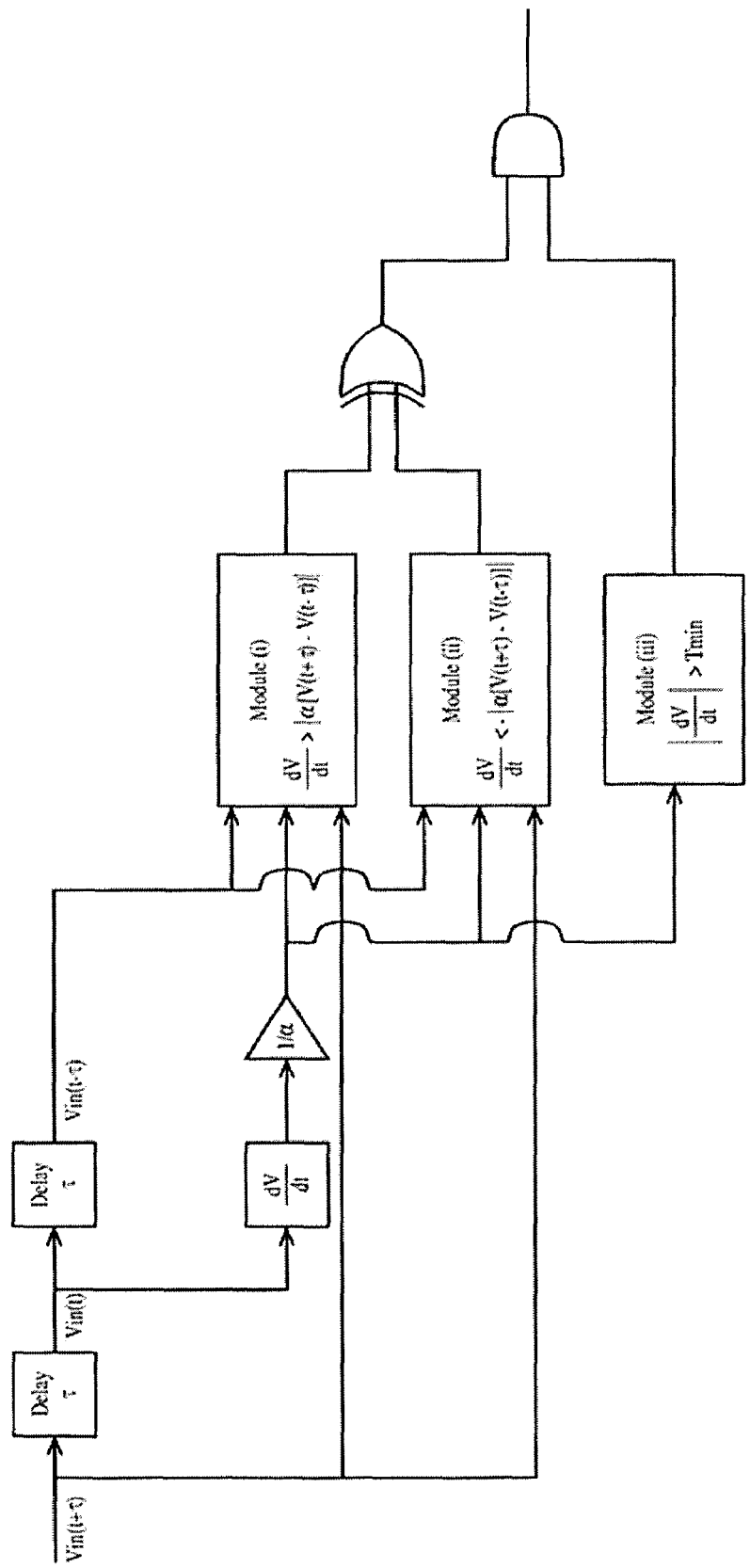
FIG. 16 is a block diagram illustrating a more detailed version of the detection method illustrated in FIG. 15.
Figure 17:
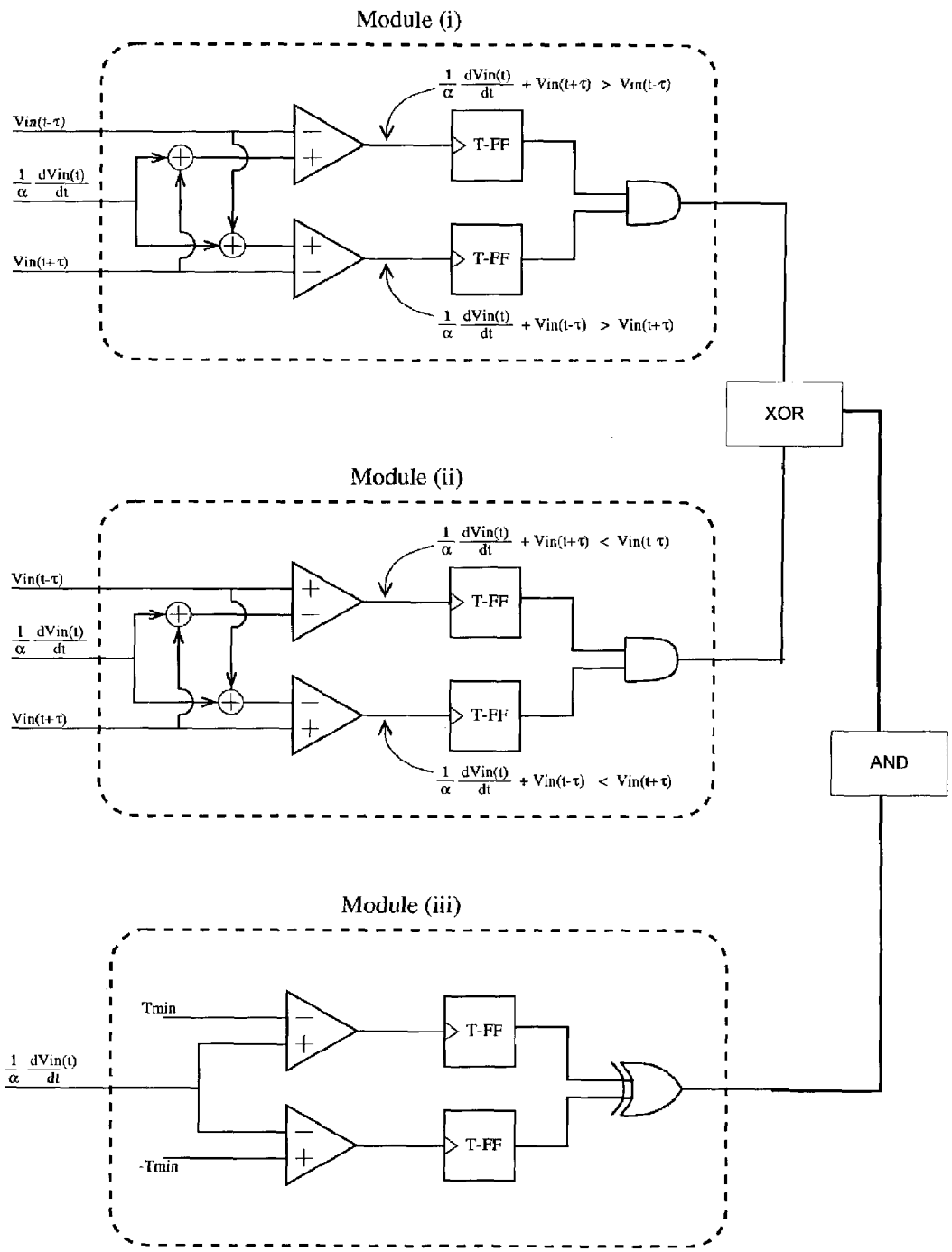
FIG. 17 is a block diagram illustrating a more detailed and exemplary implementation of the modules illustrated in FIG. 16.

The embodiment illustrated in FIGS. 15 through 17 will be called the variable threshold transition detection (VTTD) circuit. The new function blocks are used to provide the CTTD with a variable threshold that scales with the size of the level change. This effectively normalizes the threshold thereby eliminating the inconsistency illustrated in FIG. 14(b).

Referring now to FIG. 15, this Figure illustrates a variable threshold obtained by comparing a multi-level signal at different points in time. In particular, the signal Vin is delayed by an amount $\tau$ twice, splitting the signal off after each delay. This provides three instances of the signal: $V_{in}(t+\tau)$, $V_{in}(t)$, and $V_{in}(t-\tau)$. If $\tau$ is chosen to be on the order of half a symbol period (note that exactness in the value of $\tau$ is not necessary), then $V_{in}(t+\tau)$ and $V_{in}(t-\tau)$ will correspond to the middle of the data symbols for the preceding and following symbols when $V_{in}(t)$ is in the transition region. Thus, the difference $V_{in}(t+\tau)-V_{in}(t-\tau)$ provides a good estimate of the size of the level change. Scaling this difference by an appropriate factor $\alpha$ (where $\alpha$ is nominally ½ in the absence of gain on circuit elements) provides the desired threshold on a continuous basis.

The difference Vin(t+τ)−Vin(t−τ) in FIG. 15 is difficult to implement as illustrated. However, because the difference is only used by the threshold operation, which is implemented with comparators as in FIG. 3, this difference never need be explicitly performed.

Referring now to FIGS. 16 and 17, these Figures present an embodiment that functionally implements FIG. 15 but without explicitly taking the difference Vin(t+τ)−Vin(t−τ). For clarity of exposition, FIG. 16 presents the embodiment in higher-level function blocks whose specifics are given in FIG. 17.

As in FIG. 15, three instances of Vin are created by the use of a pair of τ delays. The middle tap Vin(t) is differentiated according to the embodiment previously described for the CTTD and scaled by $1/\alpha$. Note that Vin(t) is scaled by $1/\alpha$, in contrast to scaling Vin(t+τ) and Vin(t−τ) by α, to save on the number of amplifiers used. However, both approaches are inherently the same and are represented by the same embodiment.

The three signals Vin(t+τ), $1/\alpha$ Vin(t), and Vin(t−τ) are then fed into three modules. The first module (i) tests if the derivative dVin(t)/dt of the ML signal is greater than the threshold α|Vin(t+τ)−Vin(t−τ)|.

The second module (ii) tests if the derivative dVin(t)/dt is less than the threshold −α|Vin(t+τ)−Vin(t−τ)|. The 'OR'ing of these two events then corresponds to the absolute value of the derivative exceeding |α[Vin(t+τ)−Vin(t−τ)]| and thus conveys when the slope of the ML signal has exceeded the variable threshold.

The third module (iii) asserts a minimum value on the slope threshold. Note that when two adjacent symbols are the same, the variable threshold becomes zero, and modules (i) and (ii) will trigger. Module (iii) safeguards against such conditions causing a "false alarm" by additionally requiring the slope reach a minimum threshold in order to accept the results of modules (i) and (ii). While module (iii) asserts a slope on the derivative dVin(t)/dt, those skilled in the art will recognize that applying a threshold to the difference [Vin (t+τ)−Vin(t−τ)] is fundamentally the same embodiment.

FIG. 17 illustrates the details of each of the modules (i)–(iii) in FIG. 16. FIG. 17(top) shows how module (i) can be implemented. As in FIG. 16, module (i) takes as its input Vin(t−τ), $1/\alpha$ Vin(t), and Vin(t+τ). To implement the desired function, we note that the event $$d\text{Vin}(t)/dt > |\alpha[\text{Vin}(t+\tau) - \text{Vin}(t-\tau)]|$$

is equivalent to the pair of events being true $$1/\alpha\, d\text{Vin}(t)/dt + \text{Vin}(t-\tau) > \text{Vin}(t+\tau)$$

$$1/\alpha\, d\text{Vin}(t)/dt + \text{Vin}(t+\tau) > \text{Vin}(t-\tau)$$

as can be shown by those skilled in the art. The latter pair of conditions can be directly implemented as shown in FIG. 17(top) to produce the desired functionality.

In a similar fashion, module (ii) can be implemented as in FIG. 17(middle) taking advantage of the equivalence of the event $$d\text{Vin}(t)/dt < -|\alpha[\text{Vin}(t+\tau) - \text{Vin}(t-\tau)]|$$

to the pair of events $$1/\alpha\, d\text{Vin}(t)/dt + \text{Vin}(t-\tau) < \text{Vin}(t+\tau)$$

$$1/\alpha\, d\text{Vin}(t)/dt + \text{Vin}(t+\tau) < \text{Vin}(t-\tau)$$

being true. It should be evident to those skilled in the art that two of the four additions in modules (i) and (ii) are redundant and can be omitted. As previously stated, the separation of functionality into modules is for clarity of exposition and not an implementation constraint.

Finally, for third module (iii), the minimum threshold requirement can be realized with the implementation shown in FIG. 17(bottom) where the ML signal derivative is compared to the threshold Tmin. As in FIG. 3, a pair of thresholds is used to account for both when the derivative is positive and negative. The two comparators are then latched and 'OR'ed to produce the desired output.

The present invention efficiently detects clock signals in a multilevel signal. The system and method of the present invention determine clock signals from a multilevel signal that can be used in high speed communication applications. Exemplary uses of the present invention include electrical backplane, Ethernet, and optical applications.

It should be understood that the foregoing relates only to illustrate the embodiments of the present invention, and that numerous changes may be made therein without departing from the scope and spirit of the invention as defined by the following claims.

What is claimed is:

1. A system for receiving a multi-level signal and determining a clock signal from the multi-level signal comprising:
   a variable threshold transition detector for differentiating a multilevel signal to form a signal that enables detection of edges of the multi-level signal, for sampling the signal at different points in time and applying an adaptive threshold to the differentiated signal to form a thresholded signal, and for generating a binary signal based on the thresholded signal;
   a clock recovery unit for receiving the binary signal and determining a clock signal, whereby increased data transitions are realized from the multilevel signal and the period of time for determining the clock signal and jitter are reduced,
   wherein the variable threshold transition detector delays and splits the multilevel signal into three delayed signals, differentiates one of the three delayed signals, and combines the signals back into one signal for further processing by the clock recovery unit.

2. The system of claim 1, wherein the variable threshold transition detector determines if a magnitude of a derivative based on the multilevel signal is greater than a predetermined threshold value.

3. The system of claim 1, wherein the variable threshold transition detector determines if a magnitude of a derivative based on the multilevel signal is less than a predetermined threshold value.

4. The system of claim 1, wherein the variable threshold transition detector splits the multilevel signal into two signals, differentiates the two signals, thresholds the differentiated signals against two predetermined values, and combines the thresholded signals into one signal.

5. The system of claim 4, wherein the variable threshold transition detector combines the thresholded signals into one signal by using one of an exclusive-or (XOR) and logical-or (OR) operation between the two signals.

6. The system of claim 1, wherein the variable threshold transition detector delays and splits the multilevel signal into at least two delayed signals, and differentiates and splits one of the delayed signals.

* * * * *